US011982416B2

(12) United States Patent
Mayerhofer et al.

(10) Patent No.: US 11,982,416 B2
(45) Date of Patent: May 14, 2024

(54) ILLUMINANT FOR VEHICLE HEADLAMP

(71) Applicant: ZKW Group GmbH, Wieselburg (AT)

(72) Inventors: Markus Mayerhofer, Otterthal (AT); Albrecht Emmerich, Vienna (AT)

(73) Assignee: ZKW Group GmbH, Wieselburg (AT)

( * ) Notice: Subject to any disclaimer, the term of this patent is extended or adjusted under 35 U.S.C. 154(b) by 0 days.

(21) Appl. No.: 18/241,384

(22) Filed: Sep. 1, 2023

(65) Prior Publication Data
US 2024/0084989 A1    Mar. 14, 2024

(30) Foreign Application Priority Data

Sep. 9, 2022   (EP) ..................................... 22194828

(51) Int. Cl.
*F21S 41/19* (2018.01)
*F21S 45/40* (2018.01)

(52) U.S. Cl.
CPC ............. *F21S 41/192* (2018.01); *F21S 45/40* (2018.01)

(58) Field of Classification Search
CPC ................................ F21S 41/192; F21S 45/40
See application file for complete search history.

(56) References Cited

U.S. PATENT DOCUMENTS

| | | | |
|---|---|---|---|
| 2013/0087813 A1 | 4/2013 | Yan et al. | |
| 2017/0023201 A1* | 1/2017 | Hino | F21S 43/14 |
| 2020/0251626 A1* | 8/2020 | Lee | H01L 33/58 |
| 2023/0170442 A1* | 6/2023 | DiMaria | H01L 33/44 |
| | | | 257/99 |

FOREIGN PATENT DOCUMENTS

CN    109273423 A    1/2019

OTHER PUBLICATIONS

Extended European Search Report Issued in European Patent Application No. 22194828.4 dated Feb. 27, 2023 (6 Pages).
Herron et al., "Effective Voiding Control of QFN via Solder Mask Patterning," Proceedings of the 27th Electronic Components Conference (7th Electronic Components Conference, Stouffer's National Center Inn, Arlington, VA, May 16-18, 1977. Institute of Electrical and Electronics Engineers.

* cited by examiner

*Primary Examiner* — Kevin Quarterman
(74) *Attorney, Agent, or Firm* — Eversheds Sutherland (US) LLP

(57) ABSTRACT

An illuminant (1) for a motor vehicle headlight includes an SMD component (2) and a circuit carrier (4). The SMD component (2) is connected to the circuit carrier (4) by means of a solder connection, wherein the circuit carrier has a plurality of contact elements (5a), wherein in order to dissipate waste heat from the SMD component (2), the circuit carrier (4) has a plurality of micro-vias (7) designed for heat conduction, wherein a number of contact elements (5a) have a substantially hexagonal base (5b), wherein the micro-vias (7) are arranged in a two-dimensional hexagonal packing arrangement with respect to one another in such a way that the substantially hexagonal bases (5b) of the contact elements (5a) are interspersed by a plurality of micro-vias (7) substantially completely, according to the highest area packing density.

20 Claims, 2 Drawing Sheets

ILLUMINANT FOR VEHICLE HEADLAMP

CROSS-REFERENCE TO RELATED APPLICATIONS

This application claims priority to European Patent Application No. 22194828.4, filed Sep. 9, 2022, which is incorporated herein by reference.

FIELD OF THE INVENTION AND DESCRIPTION OF PRIOR ART

The invention relates to an illuminant for a motor vehicle headlight, wherein the illuminant comprises the following:
- an SMD component, comprising a light source for producing light, wherein the SMD component has a light-emitting upper side, on which the light source is arranged, and an underside facing away from the light-emitting upper side, and
- a circuit carrier, wherein the SMD component is thermally conductively and/or electrically conductively connected to the circuit carrier on a mounting section of the circuit carrier by means of a solder connection, wherein the solder connection comprises a solder layer, which has solder material, wherein the solder layer is arranged between the underside of the SMD component and the mounting section of the circuit carrier and connects the SMD component to the circuit carrier, wherein
  the mounting section of the circuit carrier has a plurality of contact elements arranged in a grid pattern and spaced apart from one another, which extend from a, preferably flat, base of the circuit carrier in the direction of the SMD component and contact a side of the solder layer facing away from the SMD component, wherein gas outlet channel sections are formed between adjacent contact elements, wherein the contact elements are arranged in relation to each other in such a way that the gas outlet channel sections form a coherent gas outlet channel system such that each contact element is surrounded by a section of the continuous gas outlet channel system, wherein the gas outlet channel sections are delimited by side surfaces of adjacent contact elements, the base and the side of the solder layer facing away from the SMD component, wherein the gas outlet channel system is designed in such a way that gases that escape from the solder layer during the soldering process can escape from a volume formed between the solder layer and the base of the circuit carrier via the gas outlet channel system,
  wherein in order to dissipate waste heat from the SMD component, the circuit carrier has a plurality of micro-vias designed for heat conduction, wherein the heat conduction occurs substantially along a longitudinal extension of the micro-vias, wherein the micro-vias are arranged in the circuit carrier in such a way that the micro-vias extend at least in sections through the circuit carrier towards the mounting section and pass through the plurality of contact elements such that the micro-vias contact the solder layer on a contact area of the solder layer for heat dissipation, wherein the micro-vias have a substantially circular cross-section on the contact area.

The invention further relates to a motor vehicle headlight, comprising an illuminant.

Illuminants for motor vehicle headlights are known in the prior art, wherein such illuminants often have an SMD component with a light source, and the SDM component is attached to a circuit carrier. The circuit carrier is usually, inter alia, also designed to cool the SMD component (or the light source), wherein this often occurs in the prior art via so-called micro-vias, which extend at least partially through the circuit carrier (or from an inner region of the circuit carrier) towards the SMD component. The SMD component is usually soldered to the circuit carrier, wherein cavities can form in the solder layer, especially in the case of solder connections with large-area solder layers (or solder layers; i.e. a layer which has solidified solder or solder material (after the soldering process) in order to create a material bond between components). The cavities are formed by gases that are produced during the soldering process (or during the liquefaction of the solder material used during the soldering process). The cavities reduce the effective contact surface between the SMD component and the circuit carrier. In order to reduce the formation of cavities, it must be ensured that the gases can escape from the solder layer, wherein corresponding gas outlet channels are usually formed between the solder layer and the circuit carrier. Such gas outlet channels reduce the effective contact surface between the solder layer and the circuit carrier, which impairs cooling. The solutions known in the prior art must therefore make a compromise between effective cooling (high number of micro-vias) and effective gas discharge (high number of gas outlet channels).

SUMMARY OF THE INVENTION

The object of the present invention consists in mitigating or eliminating the disadvantages of the prior art. The aim of the invention is therefore in particular to create an illuminant in which the solder connection between components of the illuminant is improved.

This object is achieved by an illuminant having the features described and claimed herein.

According to the invention, a number of contact elements have a substantially hexagonal base, wherein the bases lie in a plane, which is oriented substantially parallel to the base of the circuit carrier, and preferably parallel to the underside of the SMD component, wherein
  the micro-vias are arranged in a two-dimensional hexagonal packing arrangement with respect to one another in such a way that the substantially hexagonal bases of the contact elements are interspersed by a plurality of micro-vias substantially completely, according to the highest area packing density.

This can advantageously maximize the number of micro-vias per contact element area, which in turn improves the cooling of the SMD component. At the same time, gases can escape from the solder material liquefied during the soldering process through the gas outlet channel system during the production of a solid (or rigid) solder layer. The solder layer can thus be in particular substantially free of gas bubbles. In this context, a hexagonal base is understood as a polygon with six corners and six sides. The bases of the number of contact elements preferably form an equilateral hexagon (all six sides are equal in length); particularly preferably, the bases of the number of contact elements form a regular hexagon (all six sides are equal in length and moreover, all angles at the six corners are equal in size). The number of contact elements with a substantially hexagonal base can comprise all contact elements or fewer, for example at least 90%, 80%, 70%, 60% or 50% of all contact elements of the total number of contact elements. The greater the number of contact elements with a substantially hexagonal base, the more efficient the cooling of the SMD component can be because the substantially hexagonal base can be interspersed with micro-vias according to the highest packing density.

The micro-vias (preferably the heat-conducting (metal) core of the micro-vias) can in particular start from an inner area of the circuit carrier (e.g. a metal inlay) and end at the solder layer or contact it for heat conduction. The light source can comprise a pixel LED light source. The solder connection can be produced with a soldering process, which is preferably a reflow soldering process.

It can be provided that adjacent micro-vias are arranged on the hexagonal base of a contact element substantially directly adjacent to each other, wherein the plurality of micro-vias on the contact area preferably have a substantially equal diameter. Contact area should be understood as the area on which the micro-vias or the contact element contacted the solder layer.

It can be provided that the micro-vias have an inner hole diameter on the contact area, which is preferably <0.5 mm, preferably <0.25 mm, particularly preferably <0.15 mm. The micro-vias preferably have a diameter of 0.1 to 0.2 mm. The distance between adjacent micro-vias is preferably 0.1 to 0.35 mm.

It can be provided that the micro-vias are substantially conical or frustoconical along their longitudinal extension, wherein the micro-vias are preferably designed in such a way that a cone diameter or a truncated cone diameter decreases towards the solder layer, wherein in particular an angle between a cone axis or a truncated cone axis and a lateral surface of the cone or truncated cone is 6° to 15°.

It can be provided that the micro-vias are arranged in the circuit carrier in such a way that those areas of the mounting section that have the gas outlet channel system are free of micro-vias. In particular, only the contact elements are interspersed with micro-vias.

It can be provided that the circuit carrier has an outer surface facing the SMD component, on which the mounting section is formed, wherein the circuit carrier has a solder resist layer, which is at least partially, preferably completely, arranged around the mounting section on the outer surface.

It can be provided that the contact elements are coated with a thermally conductive and/or electrically conductive material, in particular with a metal, for example copper, or are formed from a thermally conductive and/or electrically conductive material.

It can be provided that the circuit carrier is designed as a multilayer printed circuit board, which has a metal inlay, preferably a copper inlay, wherein the micro-vias are thermally conductively connected to the metal inlay. The micro-vias are preferably filled with metal, in particular copper, and thermally conductively connected to the metal inlay via this metal filling. The thermally conductive filling material of the micro-vias is preferably the same material as the metal inlay of the circuit carrier.

It can be provided that the hexagonal contact elements form polyhedra, which have a hexagonal base of substantially the same size. The gas outlet channel system is in particular formed between the polyhedra. The contact elements can in particular have a first number of edge elements and a second number of central elements, wherein the edge elements are arranged on the edge of the mounting section and wherein the central elements are surrounded by the edge elements. Preferably, at least the central elements, and preferably also the edge elements, have a hexagonal base.

It can be provided that the bases of the hexagonal contact elements respectively form a regular hexagon.

It can be provided that each gas outlet channel section of the gas outlet channel system has a channel width defined as a normal distance between parallel side edges of two adjacent contact elements, wherein the gas outlet channel system is designed in such a way that all gas outlet channel sections have substantially the same channel width. The channel width of a gas outlet channel section is preferably 150-250 μm.

It can be provided that each gas outlet channel section of the gas outlet channel system has a channel height that corresponds to a normal distance between the base of the circuit carrier and the side of the solder layer facing away from the SMD component, wherein the channel height of the gas outlet channel system is preferably constant over the entire mounting section, wherein the channel height is preferably 100-200 μm. The channel height can in particular correspond to the vertical height of the contact elements (preferably the vertical height of the contact elements between the base and the solder layer). The channel height can thus be understood as the layer thickness of the contact elements.

It can be provided that the mounting section of the circuit carrier has a larger surface than the underside of the SMD component. The mounting section is preferably an area (or surface portion) formed on the circuit carrier that can be wetted with solder material and is designed to receive an SMD component and subsequently to make electrical, thermal or mechanical contact with it.

It can be provided that the connection between the SMD component and the mounting section of the circuit carrier is formed by the solder layer in such a way that the underside of the SMD component, the base of the circuit carrier and the bases of the hexagonal contact elements lie in planes that are oriented substantially parallel to one another.

It can be provided that out of the plurality of contact elements arranged in a grid pattern, at least 50%, preferably more than 75%, preferably more than 85%, particularly preferably more than 95% of the contact elements have a hexagonal base.

A motor vehicle headlight that has an illuminant according to the invention can be provided.

BRIEF DESCRIPTION OF THE DRAWINGS

The invention is outlined in more detail below based on an exemplary and non-limiting embodiment, which is illustrated in the figures. In the figures

In the following figures, unless otherwise stated, the same reference numbers denote the same features.

DETAILED DESCRIPTION OF EMBODIMENTS OF THE INVENTION

Figure 1:
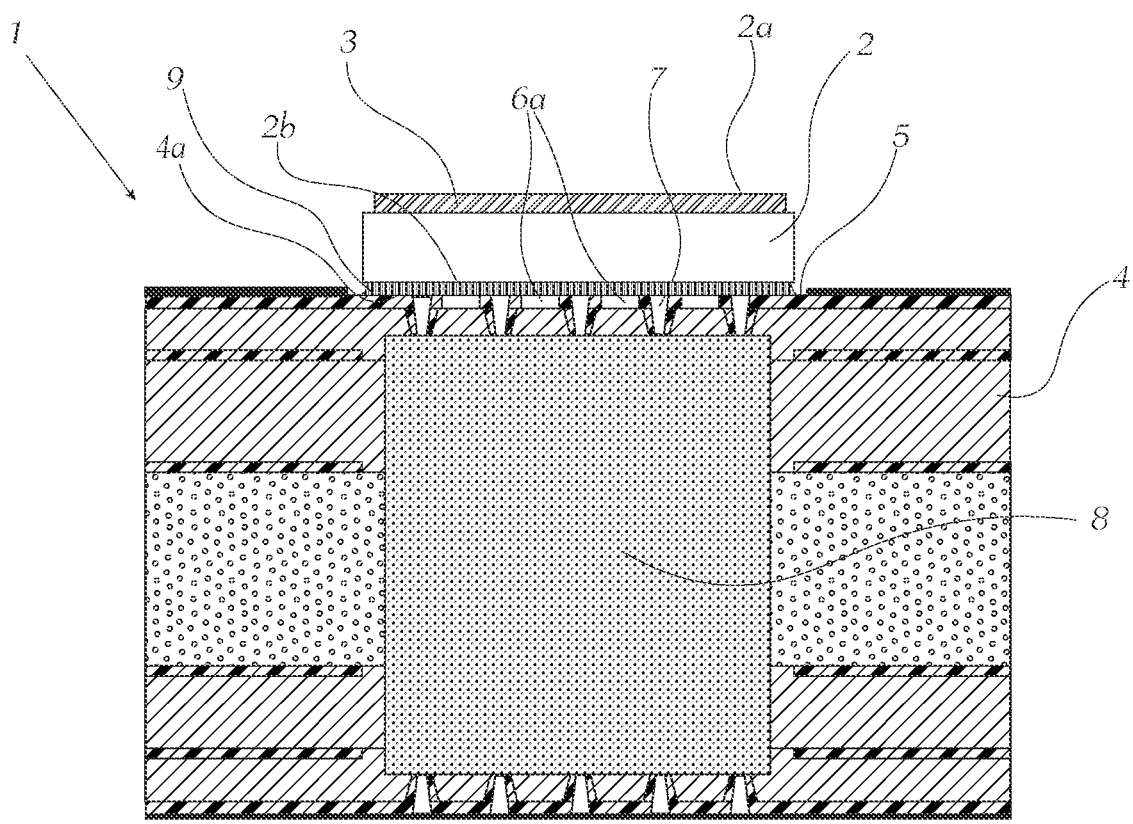
FIG. 1 shows a schematic sectional view of an illuminant according to the invention.

FIG. 1 shows a schematic sectional view of an illuminant 1 according to the invention for a motor vehicle headlight. The illuminant 1 comprises an SMD component 2 with a light source 3 for producing light. The SMD component 2 has an upper side 2a, on which the light source 3 is arranged, whereby the upper side 2a is light-emitting. The SMD component 2 further has an underside 2b facing away from the light-emitting upper side 2a. The light source 3 can be a pixel LED light source.

The illuminant 1 comprises a circuit carrier 4, wherein the SMD component 2 is thermally conductively and electrically conductively connected to the circuit carrier 4 by means of a solder connection. The solder connection is designed as a solder layer 9, which has solder material. The basic principle for producing such a solder connection is known to a person skilled in the art, which is why it will not be discussed in detail here. The solder layer 9 is arranged between the underside 2b of the SMD component 2 and a mounting section 4a of the circuit carrier 4 and connects the SMD component 2 to the circuit carrier 4. The solder connection is produced by a soldering process. The soldering process may be a reflow soldering process. In order to enable uniform application (or a uniform layer thickness) of solder material, it can, in particular for large-area solder connections (or mounting sections 4a), be advantageous to not apply the solder material continuously (during the soldering process) but rather to divide the solder material into solder material segments by means of a template. The resulting solder layer 9 (cured after its manufacturing process) is formed continuously (in particular substantially over the entire mounting section 4a).

In the exemplary embodiment shown in FIG. 1, the circuit carrier 4 is designed as a multilayer printed circuit board, which has a metal inlay 8, preferably a copper inlay. The micro-vias 7 are thermally conductively connected to the metal inlay 8. The micro-vias 7 are in particular filled with metal, preferably copper, and connected to the metal inlay 8.

Figure 2:
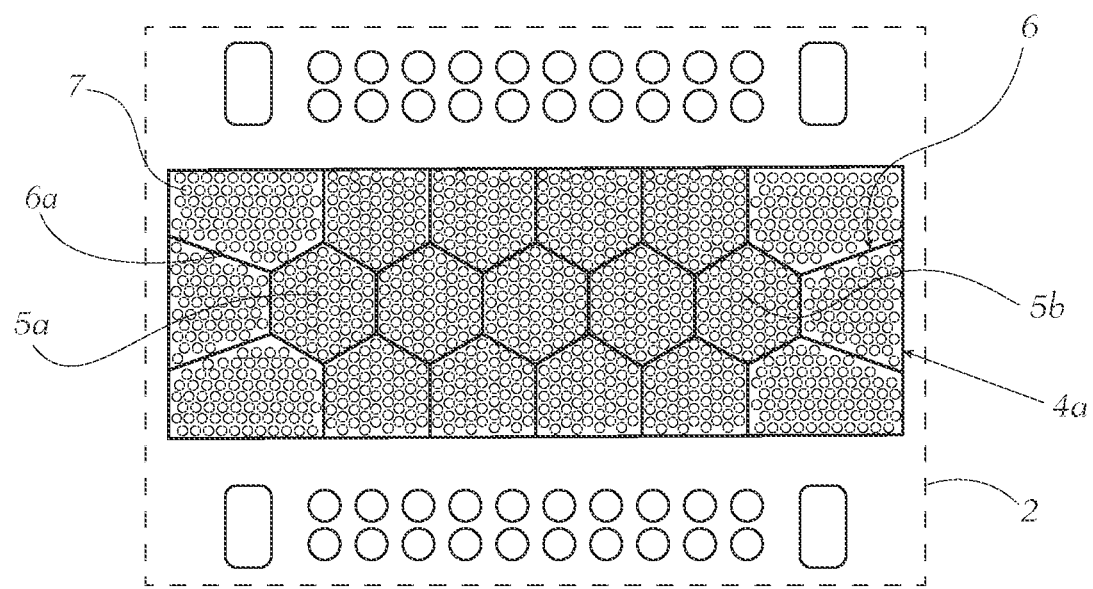
FIG. 2 shows a schematic illustration of a circuit carrier according to a first exemplary embodiment of an illuminant according to the invention.
Figure 3:
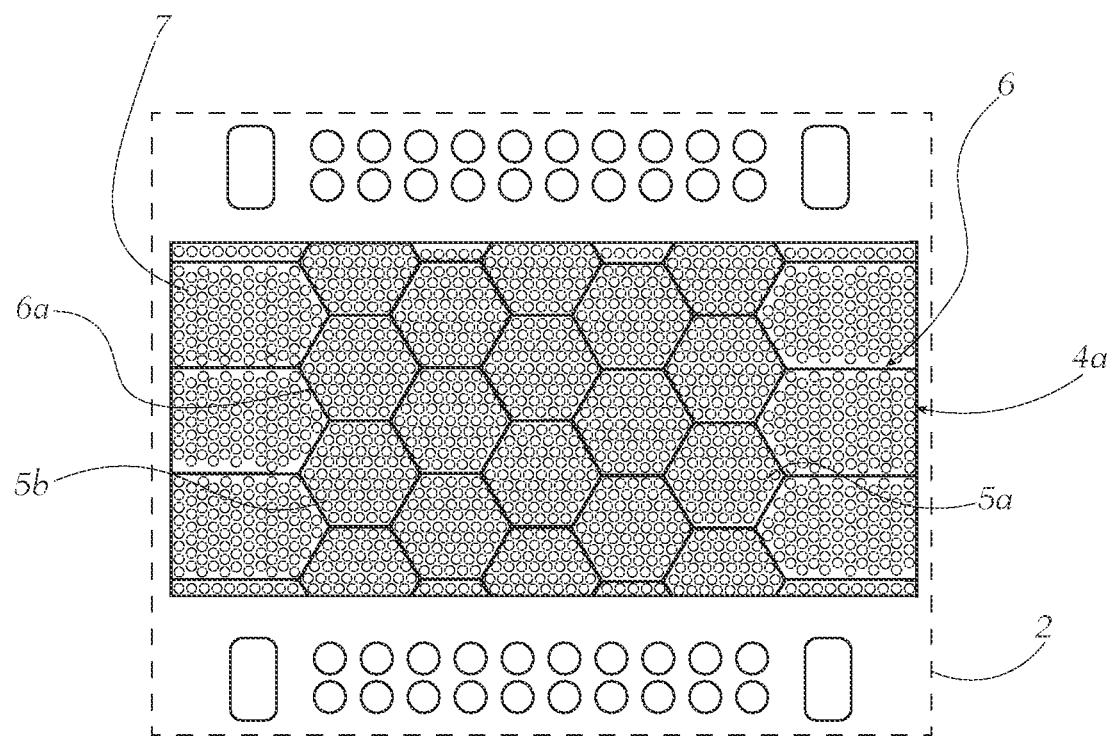
FIG. 3 shows a schematic illustration of a circuit carrier according to a second exemplary embodiment of an illuminant according to the invention.

As shown in FIG. 2 and FIG. 3, the mounting section 4a is formed from a plurality of contact elements 5a arranged in a grid pattern and spaced apart from one another, which form a contact element grid 5. Gas outlet channel sections 6a are formed between adjacent contact elements 5a. The contact elements 5a are arranged in relation to each other in such a way that the gas outlet channel sections 6a form a coherent gas outlet channel system 6 through (or in) the mounting section 4a. Each contact element 5a is surrounded by a section of the continuous gas outlet channel system 6. The gas outlet channel system 6 is designed in such a way that gases that are released during the soldering process from the liquefied solder volume that forms the solder layer 9 after cooling can escape from a volume formed between the underside 2b of the SMD component 2 and the mounting section 4a of the circuit carrier 4 via the gas outlet channel system 6.

In other words, the gas outlet channel system 6 divides the mounting section 4a into partial areas separated from one another by gas outlet channel sections 6a, wherein the gas outlet channel system 6 is designed in the mounting section 4a in such a way that the partial areas (or contact elements 5a) of the mounting section 4a have a hexagonal outline. The mounting section 4a is thus formed as a segmented mounting section 4a by the gas outlet channel system 6 penetrating the mounting section 4a, wherein the individual segments are designed as hexagonal contact elements 5a (or contact elements 5a with a hexagonal base).

In order to dissipate waste heat from the SMD component 2, the circuit carrier 4 has a plurality of micro-vias 7 designed for heat conduction, which have a substantially circular cross-section and a longitudinal extension. The heat conduction occurs substantially along the longitudinal extension of the micro-vias. The micro-vias 7 are arranged in the circuit carrier 4 in such a way that the micro-vias 7 extend at least in sections through the circuit carrier 4 towards the mounting section 4a and pass through it at least in sections or end at the solder layer 9. As a result, the micro-vias 7 pass through the mounting section 4a at a contact area of the solder layer 9 for heat dissipation. The contact area is in particular only formed on the contact elements 5a of the mounting section 4a.

As shown in FIGS. 2 and 3, a number of contact elements 5a have a substantially hexagonal base 5b. The bases 5b lie in a plane, which is oriented substantially parallel to the underside 2b of the SMD component 2.

The micro-vias 7 are arranged in a two-dimensional hexagonal packing arrangement with respect to one another in such a way that the substantially hexagonal bases 5b of the contact elements 5a are interspersed by a plurality of micro-vias 7 substantially completely, according to the highest area packing density, wherein there is preferably a minimum distance between adjacent micro-vias 7. The hexagonal base 5b of the number of contact elements 5a is thus substantially filled with the micro-vias 7, which have a substantially circular base. Adjacent micro-vias 7 are arranged within the hexagonal base 5b of the contact elements 5a substantially directly adjacent to each other. The plurality of micro-vias 7 can have a substantially equal diameter. The micro-vias 7 have an, in particular maximum, inner hole diameter d on the contact area of the solder layer 9, which is preferably <0.5 mm, preferably <0.25 mm, particularly preferably <0.15 mm. The micro-vias 7 are arranged in the mounting section 4a of the circuit carrier 4 in such a way that those areas of the mounting section 4a that have the gas outlet channel system 6 are free of micro-vias 7.

The hexagonal contact elements 5a respectively have a hexagonal base 5b of substantially the same size. The bases 5b of the hexagonal contact elements 5a respectively form a regular hexagon.

In the exemplary embodiment shown in FIG. 2, the contact element area has five central hexagonal contact elements 5a. These are surrounded by further contact elements, which have other shapes (further polygons) and are likewise interspersed with micro-vias 7. The SMD component 2 is schematically depicted around the mounting section 4a.

In the exemplary embodiment shown in FIG. 3, the mounting section 4a has twelve hexagonal contact elements 5a. These are surrounded by further contact elements, which have other shapes (further polygons) and are likewise interspersed with micro-vias 7. The SMD component 2 is schematically depicted again around the mounting section 4a.

The number of hexagonal contact elements 5a is substantially predetermined by their size and the size and shape of the mounting section 4a.

Each gas outlet channel section 6a of the gas outlet channel system 6 has a channel width defined as a normal distance between parallel side edges of two adjacent contact elements 5a. The gas outlet channel system 6 is preferably designed in such a way that all gas outlet channel sections 6a have the same channel width.

Each gas outlet channel section 6a of the gas outlet channel system 6 has a channel height that corresponds to a normal distance between the base 4b of the circuit carrier 4 and the side of the solder layer 9 facing away from the SMD component 2. The channel height of the gas outlet channel system 6 is preferably constant over the entire mounting section 4a, wherein the channel height is preferably 100-200 μm.

Out of the total number of contact elements 5a arranged in a grid pattern, at least 50%, preferably more than 75%, preferably more than 85%, particularly preferably more than 95% have a hexagonal base 5b.

The invention is not limited to the embodiments shown, but is defined by the entire scope of protection of the claims. Individual aspects of the invention or embodiments may also be adopted and combined with each other. Any reference numbers in the claims are exemplary and merely serve to make the claims easier to read, without limiting them.

The invention claimed is:

1. An illuminant (1) for a motor vehicle headlight, the illuminant (1) comprising:
    an SMD component (2), comprising a light source (3) for producing light, wherein the SMD component (2) has a light-emitting upper side (2a), on which the light source (3) is arranged, and an underside (2b) facing away from the light-emitting upper side (2a); and
    a circuit carrier (4), wherein the SMD component (2) is thermally conductively and/or electrically conductively connected to the circuit carrier (4) on a mounting section (4a) of the circuit carrier (4) by means of a solder connection, wherein the solder connection comprises a solder layer (9), which has solder material, wherein the solder layer (9) is arranged between the underside (2b) of the SMD component (2) and the mounting section (4a) of the circuit carrier (4) and connects the SMD component (2) to the circuit carrier (4),
    wherein the mounting section (4a) of the circuit carrier (4) has a plurality of contact elements (5a) arranged in a grid pattern and spaced apart from one another, which extend from a base (4b) of the circuit carrier (4) in the direction of the SMD component (2) and contact a side of the solder layer (9) facing away from the SMD component (2), wherein gas outlet channel sections (6a) are formed between adjacent contact elements (5a), wherein the contact elements (5a) are arranged in relation to each other in such a way that the gas outlet channel sections (6a) form a coherent gas outlet channel system (6) such that each contact element (5a) is surrounded by a section of the continuous gas outlet channel system (6), wherein the gas outlet channel sections (6a) are delimited by side surfaces of adjacent contact elements (5a), the base (4b) and the side of the solder layer (9) facing away from the SMD component (2), wherein the gas outlet channel system (6) is designed in such a way that gases that escape from the solder layer (9) during the soldering process can escape from a volume formed between the solder layer (9) and the base (4a) of the circuit carrier (4) via the gas outlet channel system (6),
    wherein in order to dissipate waste heat from the SMD component (2), the circuit carrier (4) has a plurality of micro-vias (7) designed for heat conduction, wherein the heat conduction occurs substantially along a longitudinal extension of the micro-vias (7), wherein the micro-vias (7) are arranged in the circuit carrier (4) in such a way that the micro-vias (7) extend at least in sections through the circuit carrier (4) towards the mounting section (4a) and pass through the plurality of contact elements (5a) such that the micro-vias contact the solder layer (9) on a contact area of the solder layer (9) for heat dissipation, wherein the micro-vias (7) have a substantially circular cross-section on the contact area,
    wherein a number of contact elements (5a) have a substantially hexagonal base (5b), wherein the bases (5b) lie in a plane, which is oriented substantially parallel to the base (4b) of the circuit carrier, and
    wherein the micro-vias (7) are arranged in a two-dimensional hexagonal packing arrangement with respect to one another in such a way that the substantially hexagonal bases (5b) of the contact elements (5a) are interspersed by a plurality of micro-vias (7) substantially completely, according to the highest area packing density.

2. The illuminant (1) according to claim 1, wherein adjacent micro-vias (7) are arranged on the hexagonal base (5b) of a contact element (5a) substantially directly adjacent to each other, wherein the plurality of micro-vias (7) on the contact area have a substantially equal diameter.

3. The illuminant (1) according to claim 1, wherein the micro-vias (7) have an inner hole diameter (d) on the contact area, which is <0.5 mm.

4. The illuminant (1) according to claim 1, wherein the micro-vias (7) are substantially conical or frustoconical along their longitudinal extension, wherein the micro-vias (7) are designed in such a way that a cone diameter or a truncated cone diameter decreases towards the solder layer (9), wherein in particular an angle between a cone axis or a truncated cone axis and a lateral surface of the cone or truncated cone is 6° to 15°.

5. The illuminant (1) according to claim 1, wherein the micro-vias (7) are arranged in the circuit carrier (4) in such a way that those areas of the mounting section (4a) that have the gas outlet channel system (6) are free of micro-vias (7).

6. The illuminant (1) according to claim 1, wherein the circuit carrier (4) has an outer surface facing the SMD component (2), on which the mounting section (4a) is formed, wherein the circuit carrier (4) has a solder resist layer, which is at least partially, arranged around the mounting section (4a) on the outer surface.

7. The illuminant (1) according to claim 1, wherein the contact elements (5a) are coated with a thermally conductive and/or electrically conductive material or are formed from a thermally conductive and/or electrically conductive material.

8. The illuminant (1) according to claim 1, wherein the circuit carrier (4) is designed as a multilayer printed circuit board, which has a metal inlay (8), wherein the micro-vias (7) are thermally conductively connected to the metal inlay (8).

9. The illuminant (1) according to claim 1, wherein the hexagonal contact elements (5a) form polyhedra, which have a hexagonal base (5b) of substantially the same size.

10. The illuminant (1) according to claim 1, wherein the bases (5b) of the hexagonal contact elements (5a) respectively form a regular hexagon.

11. The illuminant (1) according to claim 1, wherein each gas outlet channel section (6a) of the gas outlet channel system (6) has a channel width defined as a normal distance between parallel side edges of two adjacent contact elements (5a), wherein the gas outlet channel system (6) is designed in such a way that all gas outlet channel sections (6a) have substantially the same channel width.

12. The illuminant (1) according to claim 1, wherein each gas outlet channel section (6a) of the gas outlet channel system (6) has a channel height that corresponds to a normal distance between the base (4b) of the circuit carrier (4) and the side of the solder layer (9) facing away from the SMD component (2), wherein the channel height of the gas outlet channel system (6) is constant over the entire mounting section (4a).

13. The illuminant (1) according to claim 1, wherein the mounting section (4a) of the circuit carrier (4) has a larger surface than the underside (2b) of the SMD component.

14. The illuminant (1) according to claim 1, wherein out of the plurality of contact elements (5*a*) arranged in a grid pattern, at least 50% of the contact elements (5*a*) have a hexagonal base (5*b*).

15. A motor vehicle headlight comprising an illuminant (1) according to claim 1.

16. The illuminant (1) according to claim 1, wherein the base (4*b*) of the circuit carrier (4) is flat.

17. The illuminant (1) according to claim 1, wherein the bases (5*b*) lie in a plane, which is parallel to the underside (2*b*) of the SMD component (2).

18. The illuminant (1) according to claim 3, wherein the micro-vias (7) have an inner hole diameter (d) which is <0.15 mm.

19. The illuminant (1) according to claim 12, wherein the channel height is from 100 μm to 200 μm.

20. The illuminant (1) according to claim 14, wherein more than 95% of the contact elements (5*a*) arranged in a grid pattern have a hexagonal base (5*b*).

* * * * *